(12) United States Patent
Groiss et al.

(10) Patent No.: US 6,559,786 B2
(45) Date of Patent: May 6, 2003

(54) CIRCUIT ARRANGEMENT FOR CONVERSION OF AN INPUT CURRENT SIGNAL TO A CORRESPONDING DIGITAL OUTPUT SIGNAL

(75) Inventors: Stefan Groiss, Villach (AT); Johannes Karl Sturm, Villach (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/973,371

(22) Filed: Oct. 9, 2001

(65) Prior Publication Data

US 2002/0070888 A1 Jun. 13, 2002

(30) Foreign Application Priority Data

Oct. 13, 2000 (DE) .......................... 100 50 706

(51) Int. Cl.[7] .............................. H03M 1/06; H03M 1/34
(52) U.S. Cl. ........................................ 341/158; 341/118
(58) Field of Search ........................ 341/155, 118, 341/120, 156, 158, 162; 327/65

(56) References Cited

U.S. PATENT DOCUMENTS 5,489,904 A * 2/1996 Hadidi ........................ 341/156
5,579,006 A * 11/1996 Hasegawa et al. .......... 341/162

FOREIGN PATENT DOCUMENTS

| DE | 68927655 T2 | 2/1990 |
| DE | 4306646 A1 | 9/1993 |

* cited by examiner

Primary Examiner—Patrick Wamsley
(74) Attorney, Agent, or Firm—Jenkins & Wilson, P.A.

(57) ABSTRACT

The invention provides a circuit arrangement for conversion of an input current signal (11) to a digital output signal (43). In particular, the invention relates to a method for providing a low-capacitance voltage node for a comparator input of a tracking analog/digital converter. An input circuit node (12a) is supplied with an input current signal (11). A feedback current signal (13) is produced by the input circuit node (12a) in order to operate a tracking analog/digital converter. A difference current signal (14) is likewise produced by the input circuit node (12a), and is supplied to a transimpedance resistance element (15) connected to the input circuit node. A second connection of the transimpedance resistance element (15) is connected to a reference circuit node (12b). An intermediate variable (22) is produced at the reference circuit node (12b), and is supplied to a downstream converter device (23). A constant voltage with respect to ground (33) is maintained at the input circuit node (12a). The reference circuit node (12b) has a low capacitance with respect to ground (33). There are thus no parasitic capacitances, or only negligible parasitic capacitances at the input of a downstream comparator (44) of a tracking analog/digital converter, which means that there are virtually no time delays in the analog/digital conversion, and the speed of subsequent analog/digital conversion is thus increased.

16 Claims, 3 Drawing Sheets

US 6,559,786 B2

CIRCUIT ARRANGEMENT FOR CONVERSION OF AN INPUT CURRENT SIGNAL TO A CORRESPONDING DIGITAL OUTPUT SIGNAL

TECHNICAL FIELD

The present invention relates to a circuit arrangement for conversion of an input current signal to a corresponding digital output signal, and relates in particular to the detection of very small currents and to their conversion to digital output signals by means of a tracking analog/digital converter.

RELATED ART

Although it can be applied to any desired circuit arrangements or systems, the present invention and the problems on which it is based are explained with reference to current/voltage conversion at a low-capacitance circuit node, specifically for use in a tracking analog/digital converter with a current input and resolution in the nA range.

Circuit arrangements for conversion of analog input signals to digital output signals are generally known, for example as described in "Profos/Pfeifer, Handbuch der Messtechnik [Instrumentation Manual], Oldenbourg Verlag, 1992, pages 284–289". In particular, tracking analog/digital converters are also known, as described, for example, in "E. Schrüfer, Elektrische Messtechnik [Electrical Instrumentation], Hanser Verlag, 1995, pages 351–352". Such conventional tracking analog/digital converters admittedly offer a certain improvement in terms of the conversion rate over incremental analog/digital step converters, which are likewise known and in which the digital output value is always approximated starting at zero. Incremental analog/digital step converters are described, for example, in "E. Schrüfer, Elektrische Messtechnik [Electrical Instrumentation], Hanser Verlag, 1995, pages 350–351".

FIG. 4 shows a block diagram of a tracking analog/digital converter according to the prior art. In tracking analog/digital converters, the digital output signal 43 is produced by a count of a counting device 46. The counting device 46 is, for example, in the form of an up/down counter.

Control of the counting device 46 by means of a control signal 45 is described in detail in the following text.

A summation device 401 has at least two inputs, of which one input is inverted (−). A non-inverting input is supplied with an analog input signal 41. An inverting input is supplied with an analog feedback signal 402. One output of the summation device 401 is connected to one input of a comparator 44, to which a comparator input signal 403 is supplied which corresponds to a summation of the non-inverted analog input signal and of the inverted analog feedback signal 402.

One output of the comparator 44 is connected to one input of the counting device 46, with the counting device 46 being supplied with a control signal 45 from the output of the comparator 44. One output of the counting device 46 is connected to one input of a digital/analog converter 42, to which a digital output signal 43 is supplied. The digital/analog converter 42 converts the digital output signal 43 to an analog feedback signal 402, which is in turn supplied to the inverting input (−) of the summation device 401.

In the conventional tracking analog/digital converter shown in FIG. 4, the comparator 44 together with the summation device 401 determines whether an analog input signal 41 is greater than or less than an analog feedback signal 402. For this purpose, the summation device 401 adds the analog input signal 41 and the inverted (minus sign in FIG. 4) analog feedback signal 402. In this way, the two following sequences ((i) and (ii)) are possible:

(i) The analog input signal 41 is greater than the analog feedback signal 402: the comparator input signal 403 is positive, which results in the counting device 46 counting upward. This increases the count of the counting device 46, and thus the digital output signal 43. After digital/analog conversion of the digital output signal 43 in the digital/analog converter 42, the analog feedback signal 402 is thus also increased. This process is continued until the analog feedback signal 402 corresponds to the analog input signal 41.

(ii) The analog input signal 41 is less than the analog feedback signal 402: the comparator input signal 403 is negative, which results in the counting device 46 counting downward. This reduces the count of the counting device 46, and thus the digital output signal 43. After digital/analog conversion of the digital output signal 43 in the digital/analog converter 42, the analog feedback signal 402 is thus also reduced. This process is continued until the analog feedback signal 402 corresponds to the analog input signal 41.

It can clearly be seen by comparison of the two sequences (i) and (ii) that the digital output signal 43 from the counting device 46 follows the analog input signal 41 in time with the clock which is defined by the clock signal 47 and, finally, on reaching a count which corresponds to the analog input signal 41, fluctuates about the least significant bit (LSB) of the counting device. It can likewise be seen that the count of the counting device 46, and hence the digital output signal 43, can vary only by one LSB per clock cycle. In order to allow fast analog/digital conversion to be carried out, the clock cycle should be short, or the clock rate of the clock signal 47 should be high.

The clock rate is supplied to a first input of the counting device 46 by means of a clock signal 47. The control signal 45, which is supplied to a second input of the counting device, defines the counting direction.

The clock rate is essentially limited by the presence of parasitic effects.

FIG. 3 shows a converter device according to the prior art for provision of an analog voltage which is further processed by a comparator in a downstream tracking analog/digital converter. In this case, direct current/voltage conversion is carried out at an input circuit node 12a. For this purpose, the input circuit node 12a is supplied with an input current signal 11. A difference current signal 14 and a feedback current signal 13 are produced by the input circuit node 12a. There is a total parasitic capacitance 31, which is generally high, between the input circuit node 12a and ground 33. Furthermore, there is a resistance element 32 between the input node 12a and a defined, constant voltage. In this conventional circuit arrangement, the resistance element 32 is used to carry out current/voltage conversion. In this way, the difference current signal 14 is converted to a comparator input signal 403, which represents an analog voltage. This analog voltage forms an input signal for a downstream comparator 44 (shown in FIGS. 4 and 5), which the comparator input signal 403 then compares with a reference voltage.

Conventional tracking analog/digital converters at the input node 12a limit the conversion rate.

The difference current signal must be converted to a voltage which can be further-processed in a comparator that follows in the signal flow plan. In this case, one problem that arises is that the voltage change which occurs across the resistance element as a result of the voltage drop of the difference current signal is applied to the input circuit node 12a, which is subject to a parasitic capacitance of unknown magnitude, which is generally high, and this leads to a time delay as a result of the charge-reversal effects in this parasitic capacitance.

Conventional tracking analog/digital converters also have a further disadvantage in that large errors occur in the detection of very small currents, of less than 1 nA during conventional current/voltage conversion.

Yet another disadvantage of conventional tracking analog/digital converters is that the voltage change in the difference current signal is applied to a node which is subject to parasitic capacitances, and that the charge reversal in the parasitic capacitances results in a time delay, in which case the comparator has to make a decision in each clock cycle and therefore has to wait for the voltage change at a reference circuit node.

SUMMARY OF THE INVENTION

The invention is thus based on the object of providing a circuit arrangement which converts an input current signal to a digital output signal quickly and without the disadvantageous influence of parasitic effects on the conversion rate.

According to the invention, said object is achieved by a converter device for conversion of the analog input current signal to a corresponding analog voltage, with the output of the converter device being connected to a reference circuit node, which is designed to have low capacitance, and the input circuit node 12a being kept at a constant voltage.

Accordingly, one advantage of the invention is that the rate for conversion of an analog input current signal to a digital output signal is greater than that with conventional circuit arrangements for analog/digital conversion, since parasitic effects on the input circuit node do not lead to any time delay in a comparator input signal.

The essence of the invention is a converter device which allows an input current signal, which is applied to an input circuit node and is subject to parasitic capacitances by virtue of the circuitry, to be converted to an output signal which is produced at a reference circuit node which has no parasitic capacitances, or negligibly small parasitic capacitances, with the input circuit node 12a being kept at a constant voltage, as a result of which the parasitic capacitances at the input circuit node do not have any negative effect. The conversion rate of a downstream analog/digital converter which is connected to the reference circuit node can in this way be increased in comparison to that of circuit arrangements according to the prior art.

Advantageous developments and improvements of the respective subject matter of the invention can be found in the dependent claims.

According to one preferred development, the converter device has a field-effect transistor whose gate-source voltage results in a constant voltage with respect to ground being applied to the input circuit node, and with a reference circuit node being designed to have low capacitance. In this case, a transimpedance resistance element is connected between the input circuit nodes and the reference circuit nodes, with the reference circuit node being connected to a defined potential via a current source or a resistor.

According to a further preferred development, the converter device has an operational amplifier which is fed back to a transimpedance resistance element. In this case, one inverting input of the operational amplifier is connected to the input circuit node, while the other input of the operational amplifier is kept at a reference voltage by means of a reference voltage source.

According to a further preferred development, a bipolar transistor is used instead of a field-effect transistor.

According to a further preferred development, the transimpedance resistance element is in the form of an active load which is formed, for example, by transistors or other circuit elements.

BRIEF DESCRIPTION OF THE DRAWINGS

Exemplary embodiments of the invention are explained in more detail in the following description and are illustrated in the drawings, in which.

DETAILED DESCRIPTION OF THE INVENTION

Figure 5:
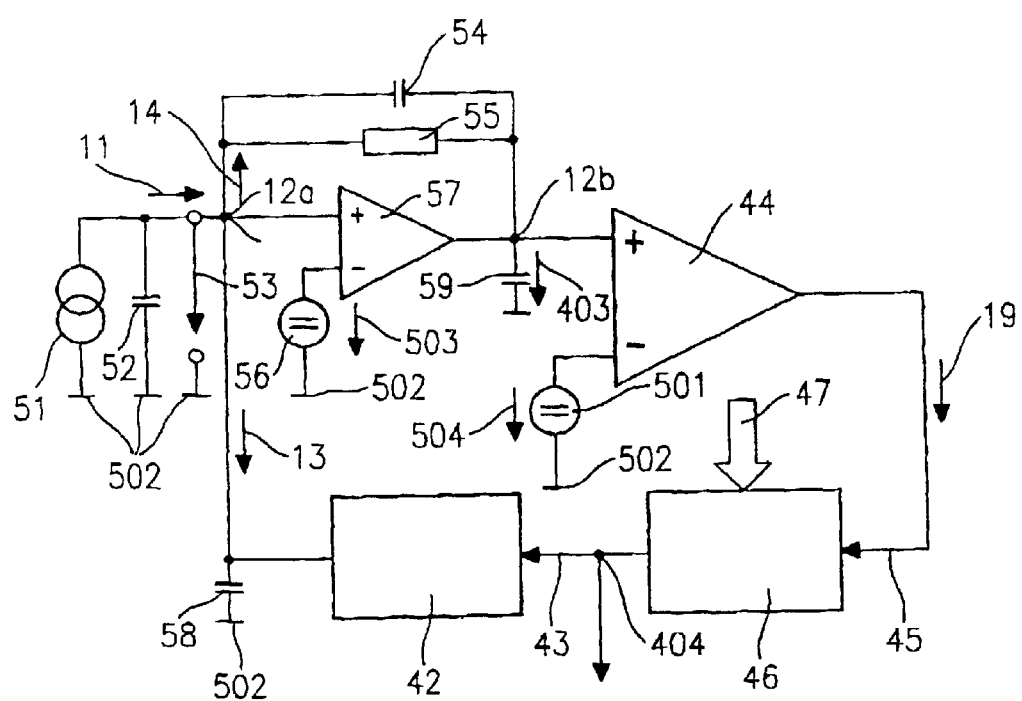
FIG. 5 shows the overall design of a tracking analog/digital converter with a matched converter device according to the present invention.

One preferred exemplary embodiment of the invention relates to a circuit arrangement, as shown in FIG. 5, for increasing the conversion rate in a tracking analog/digital converter.

FIG. 5 shows an exemplary embodiment of a tracking analog/digital converter, with a converter device 57 according to the present invention arranged between an input circuit node 12a and a reference circuit node 12b.

The converter device 57 will be described in detail in the following text, with reference to FIG. 1.

As illustrated in FIG. 5, a current source 51 has a first connection which is connected to ground 502, and a second connection which is connected to the input circuit node 12a. Any parasitic capacitance 52 that occurs is located between the input circuit node 12a and ground 502. An input voltage 53 is applied between the input circuit node 12a and ground 502. Furthermore, an inverting input (−) of a converter device or of a decoupling device 57 is connected to the input circuit node 12a. A non-inverting input (+) of the converter device 57 is connected to ground via a reference voltage source 56, which provides a reference voltage 503. One output of the converter device 57 is connected to a reference circuit node 12b. The converter device has a feedback path between the reference circuit node 12b and the input circuit node 12a, comprising a transimpedance resistance element 55. The feedback path of the converter device 57 passes a difference current signal 14 between the two nodes 12a and 12b. There is a comparator input signal 403 in parallel with any parasitic capacitance 403 that occurs between the reference circuit node 12b and ground 502.

The converter device 57 stabilizes the voltage at the input node 12a, so that the parasitic capacitances that exist at this node do not have any negative effects.

Parasitic effects in the form of parasitic capacitances occur in this exemplary embodiment. By way of example, parasitic capacitances occur at the following points, as shown in FIG. 5:

(i) The parasitic capacitance 52 occurs at the current source 51 that produces the analog input current signal 11, and this parasitic capacitance 52 may also be dependent on the applied input voltage 53. In one exemplary embodiment, the current source 51 may be formed by a reverse-biased photodiode supplying a low-level photocurrent. The influence of this parasitic capacitance 52 on the converter response of the downstream tracking analog/digital converter represents a major problem in the prior art, which is overcome only by the circuit arrangement and the method in the present invention.

(ii) A second parasitic capacitance 58 that needs to be taken into account occurs at the output of the digital/analog converter 42, which supplies the feedback current signal 13. This parasitic capacitance 58 assumes high values particularly when the digital/analog converter 42 that is used has high resolution, or a large number of bits.

Figure 3:
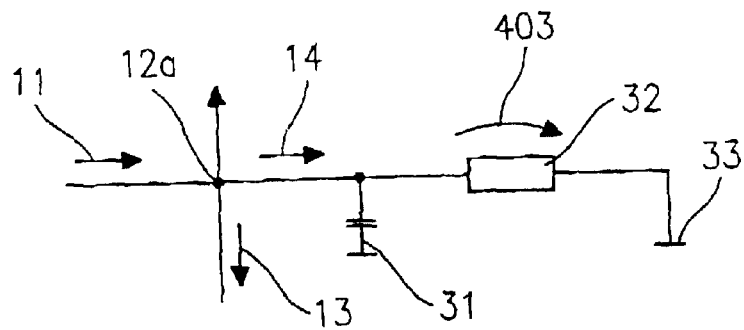
FIG. 3 shows a converter device for providing an analog voltage, according to the prior art.

The parasitic capacitances 52 and 58 that occur in this exemplary embodiment according to the present invention add up to form a parasitic total capacitance 31 (shown in FIG. 3) which, in conventional analog/digital converters, leads to a considerable time delay. The occurrence of parasitic capacitances is not restricted to the two points (i), (ii) and, in fact, parasitic capacitances can occur at other points, instead of these or in addition to them, depending on the circuit arrangement.

In particular, a parasitic capacitance 59 also occurs at the reference circuit node 12b, once again causing a time delay to the comparator input signal 403. However, this parasitic capacitance 59 can now be minimized by the circuit design according to the present invention. Without the converter device 57 according to the invention, the input of a comparator 44 would be subject to the parasitic capacitance 52 of the current source 51 and the described parasitic capacitance 58 of one output of a digital/analog converter 42, which cannot be minimized by the circuit design, in the same way as the parasitic capacitance 59.

One input of a comparator 44 is connected to the reference circuit node 12b, while the other input of the comparator 44 is connected to one connection of the reference voltage source 501, which provides a reference voltage 504 for the comparator 44 and whose other connection is connected to ground 502.

The output of the comparator 44 produces the control signal 45 for a counting device 46 by connecting the output of the comparator 44 to an input of the counting device 46.

Figure 4:
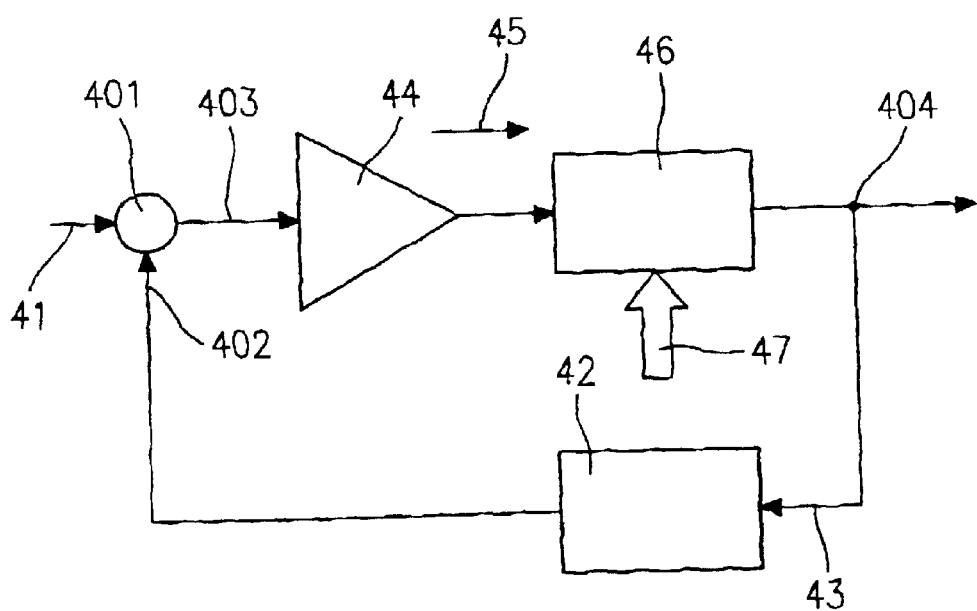
FIG. 4 shows a block diagram of a tracking analog/digital converter according to the prior art.

The way in which the control signal 45 controls the counting device 46 has been described above with reference to FIG. 4.

The count represents the digital output signal 43, which is produced at an output circuit node 404 of the counting device 46. This digital output signal 43 is used as the output signal from the circuit arrangement according to the invention and is provided for a further-processing device (not shown) or is supplied to a display device (not shown).

Furthermore, the digital output signal 43 is supplied to a digital/analog converter 42, which converts the digital output signal 43 to an analog feedback current signal 13. The output of the digital/analog converter 42 is connected to the input circuit node 12a. There is a parasitic capacitance 58 between the output of the digital/analog converter 42 and the input circuit node 12a. The parasitic capacitance 58 is thus in parallel with the parasitic capacitance 52, and in this way reinforces the disadvantageous influences of parasitic effects on the time response of conventional tracking analog/digital converters. The parasitic capacitance 58 assumes high values particularly when the digital/analog converter 42 that is used has high resolution or a large number of bits.

As can be seen from FIG. 5, the reference circuit node 12b is decoupled from the input circuit node 12a by the converter device 57. The parasitic capacitances 52 and 58 in the circuit arrangement according to the invention therefore have no disadvantageous effects on the time response, since the voltage across these capacitances is kept constant. Only the parasitic capacitance 59 at the input of the comparator 44 need be regarded as having any disturbing effects on the time response of the overall circuit arrangement. However, according to the invention, this parasitic capacitance 59 is minimized by circuit simulation of the converter device 57, together with the transimpedance resistance element 55 and the parasitic transimpedance capacitance 54. Any time delay in the tracking analog/digital converter according to the invention is thus also minimized, that is to say, for example, small currents are converted to a digital output signal considerably more quickly than was possible in the past with circuit arrangements according to the prior art.

Figure 2:
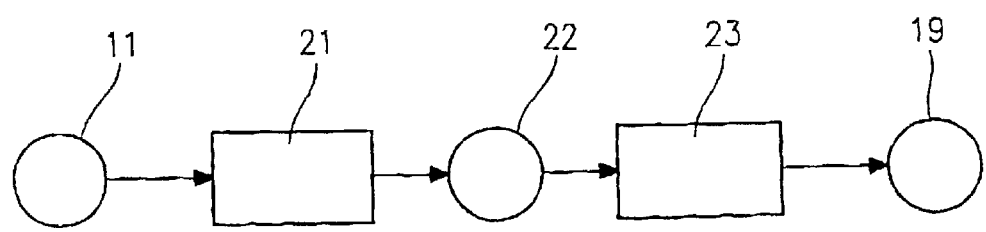
FIG. 2 shows a block diagram of the circuit arrangement according to the invention in order to illustrate the principle of the invention.

The basic principle of the invention will be explained in the following text with reference to the block diagram illustrated in FIG. 2. FIG. 2 shows a block diagram of the circuit arrangement according to the invention. An input current signal 11 is supplied to a first converter device 21, 57. The first converter device 21, 57 converts the input current signal 11 to an intermediate variable 22. The intermediate variable 22 is supplied to a second converter device 23, 44. The second converter device 23, 44 converts the intermediate variable 22 to an output signal 19. In one exemplary embodiment according to the present invention, the input current signal 11 is converted to a digital output signal 19. The first converter device 21, 57 is used to produce an intermediate variable 22, which allows the second converter device 23, 44 to be operated without the disadvantageous influences of the parasitic effects mentioned above. The disadvantageous influences of parasitic effects consist primarily of a reduction in the conversion rate of the second converter device 23 and, overall, this leads to a time delay in the production of the output signal 19.

Figure 1:
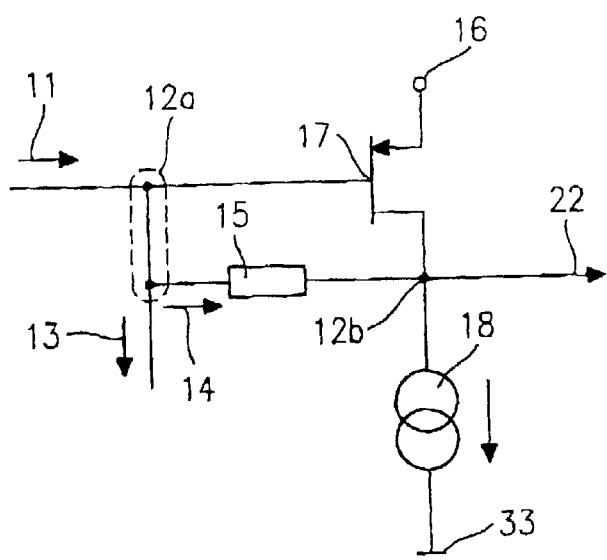
FIG. 1 shows an exemplary embodiment of a converter device according to the present invention.

FIG. 1 shows an exemplary embodiment of a converter device which is annotated by the reference symbols 21, 57 in the block diagram in FIG. 2. The circuit arrangement illustrated in FIG. 1 is also referred to as a transimpedance amplifier. As shown in FIG. 1, an input current signal 11 is supplied to an input circuit node 12a. A feedback current signal 13 is produced from the input circuit node 12a, in order to operate the tracking analog/digital converter illustrated in FIG. 5. A difference current signal 14 is likewise produced by the input circuit node 12a, and is supplied to a transimpedance resistance element 15 connected to the input circuit node. In an alternative embodiment, an active transimpedance, such as a transistor, is used instead of a resistive transimpedance resistance element. A second connection of the transimpedance resistance element 15 is connected to the reference circuit node 12b. The input circuit node 12a is connected to a gate connection of a field-effect transistor 17. The field-effect transistor 17 is an NMOS transistor or a PMOS transistor. In an alternative embodiment, a bipolar transistor is used instead of a field-effect transistor. A source connection of the field-effect transistor 17 is connected to a supply voltage connection 16. A drain connection of the field-effect transistor 17 is connected to the reference circuit node 12b. A current source 18 is connected between the reference circuit node 12b and ground 33.

An intermediate variable 22 is produced at the reference circuit node 12b, and is supplied to a downstream converter device 23 (FIG. 2). The gate-source voltage of the field-effect transistor 17 maintains a constant voltage with respect to ground 33 at the input circuit node 12a. In the circuit arrangement according to the invention, the reference circuit node 12b is designed to have low capacitance to ground 33. There are therefore no parasitic capacitances, or only negligibly small parasitic capacitances, at the input of a downstream comparator 44 (FIG. 4) in a tracking analog/digital converter, and these do not lead to any time delay, or only to a negligibly small time delay, during analog/digital conversion, hence increasing the speed of downstream analog/digital conversion.

The invention provides a circuit arrangement for conversion of an input current signal 11 to a digital output signal 43. In particular, the invention relates to a method for producing a low-capacitance voltage node for a comparator input of a downstream tracking analog/digital converter. An input current signal 11 is supplied to an input circuit node 12a. A feedback current signal 13 is produced by the input circuit node 12a, in order to operate a tracking analog/digital converter. A difference current signal 14 is likewise produced by the input circuit node 12a, and is supplied to a transimpedance resistance element 15 connected to the input circuit node. A second connection of the transimpedance resistance element 15 is connected to a reference circuit node 12b. An intermediate variable 22 is produced at the reference circuit node 12b, and is supplied to a downstream converter device 23. A constant voltage with respect to ground 33 is maintained at the input circuit node 12a. The reference circuit node 12b has low capacitance to ground 33. There are thus no parasitic capacitances, or only negligible parasitic capacitances, at the input of a downstream comparator 44 in a tracking analog/digital converter, so that these do not lead to any time delay during analog/digital conversion, thus increasing the speed of downstream analog/digital conversion.

What is claimed is:

1. A circuit arrangement for conversion of an analog input current signal to a corresponding digital output signal having:
    a) an input circuit node for application of the analog input current signal;
    b) a reference circuit node for producing a comparator input signal;
    c) a converter device for conversion of the analog input current signal to the comparator input signal, with the converter device decoupling the input circuit node from the reference circuit node with respect to any parasitic capacitance at the input circuit node, and the input circuit node being kept at a constant voltage;
    d) a comparator for comparison of the comparator input signal with a reference voltage, and for producing a corresponding control signal;
    e) a clocked counting device which counts upward or downward as a function of the received control signal, and which produces the digital output signal at an output circuit node; and having
    f) a digital/analog converter for conversion of the digital output signal to an analog feedback current signal which is fed back to the input circuit node.

2. The circuit arrangement as claimed in claim 1, wherein the converter device has a transistor whose control voltage means that a constant voltage with respect to ground is present at the input circuit node, with the reference circuit node being designed to have low capacitance.

3. The circuit arrangement as claimed in claim 2, wherein the transistor in the converter device is a field-effect transistor or a bipolar transistor.

4. The circuit arrangement as claimed in claim 2, wherein the transistor of the converter device is an NMOS or a PMOS transistor.

5. The circuit arrangement as claimed in claim 1, wherein a transimpedance resistance element is arranged between the input circuit node and the reference circuit node.

6. The circuit arrangement as claimed in claim 5, wherein the transimpedance resistance element is in the form of an active load, which is formed by transistors or other circuit elements.

7. The circuit arrangement as claimed in claim 1, wherein the converter device is an operational amplifier, which is fed back to a transimpedance resistance element.

8. The circuit arrangement as claimed in claim 7, wherein one input of the operational amplifier is connected to the input circuit node, while the other input of the operational amplifier is kept at a reference voltage by means of a reference voltage source.

9. The circuit arrangement as claimed in claim 1, wherein the counting device counts upward and downward as a function of a clock signal.

10. The circuit arrangement as claimed in claim 9, wherein the clock signal is connected to a clock input of the counting device.

11. The circuit arrangement as claimed in claim 1, wherein the converter device has:
    a) is arranged between the input circuit node and the reference circuit node;
    b) a supply connection for application of a constant voltage;
    c) a transistor whose control connection is connected to the input circuit node, having a connection which is connected to the supply connection and having a connection which is connected to the reference circuit node; and
    d) a current source or a resistor, which is connected via a first connection to a constant voltage and via a second connection the reference circuit node.

12. The circuit arrangement as claimed in claim 1, wherein the reference circuit node is connected via a current source or a resistor to a constant voltage.

13. The circuit arrangement as claimed in claim 1, wherein the comparator has a first input connection, which is connected to the reference circuit node, and a second input connection, which is connected to a power source, with the comparator output being connected to an input of a counting device.

14. The circuit arrangement as claimed in claim 1, wherein one input of the digital/analog converter is connected to one output of the counting device, and wherein one output of the digital/analog converter is connected to the input circuit node.

15. A method for conversion of an analog input current signal to a corresponding digital output signal having the following steps:
    a) application of the analog input current signal to an input circuit node;
    b) production of a comparator input signal by a reference circuit node;
    c) minimization of any voltage change at the input circuit node, which is decoupled from the reference circuit node;
    d) comparison of the comparator input signals with a reference voltage in a comparator which produces a corresponding control signal;
    e) upward counting and downward counting by means of a counting device as a function of the control signal that is produced, with the counter signal emitted from the counting device forming the digital output signal;
    f) conversion of the digital output signal to a feedback current signal, which is fed back to the input circuit node.

16. The method as claimed in claim 15, in which a voltage change occurs at the reference circuit node.

* * * * *